United States Patent
Zhu et al.

(10) Patent No.: US 9,530,466 B1
(45) Date of Patent: Dec. 27, 2016

(54) SYSTEM AND METHOD FOR MEMORY ACCESS DYNAMIC MODE SWITCHING

(71) Applicant: MARVELL INTERNATIONAL LTD., Hamilton (BM)

(72) Inventors: Jun Zhu, San Jose, CA (US); Saswat Mishra, Santa Clara, CA (US)

(73) Assignee: MARVELL INTERNATIONAL LLC. (BM)

( * ) Notice: Subject to any disclaimer, the term of this patent is extended or adjusted under 35 U.S.C. 154(b) by 161 days.

(21) Appl. No.: 14/596,322

(22) Filed: Jan. 14, 2015

Related U.S. Application Data

(60) Provisional application No. 61/927,316, filed on Jan. 14, 2014.

(51) Int. Cl.
| | |
|---|---|
| G06F 12/06 | (2006.01) |
| G11C 7/10 | (2006.01) |
| G06F 13/30 | (2006.01) |
| G06F 13/16 | (2006.01) |

(52) U.S. Cl.
CPC ............. *G11C 7/1009* (2013.01); *G06F 12/06* (2013.01); *G06F 13/1689* (2013.01); *G06F 13/30* (2013.01)

(58) Field of Classification Search
CPC .... G11C 7/1009; G06F 13/1689; G06F 13/30; G06F 12/06
See application file for complete search history.

(56) References Cited

U.S. PATENT DOCUMENTS

| | | | | |
|---|---|---|---|---|
| 5,978,003 A | * | 11/1999 | Brenner, Jr. ......... | G03G 15/755 347/116 |
| 9,330,730 B2 | * | 5/2016 | Makley ................ | G11B 33/128 |

* cited by examiner

*Primary Examiner* — John A Lane

(57) ABSTRACT

Systems, methods, and other embodiments associated with providing dynamic switching between memory access modes are described. According to one embodiment, an apparatus includes first memory and second memory. The apparatus also includes a memory control logic configured to facilitate memory access of the first memory and the second memory using either a first memory access mode or a second memory access mode. The first memory access mode is configured to facilitate memory access of both the first memory and the second memory. The second memory access mode is configured to facilitate memory access of one of the first memory or the second memory. The memory control logic is configured to dynamically switch between the first memory access mode and the second memory access mode, without having to remap memory or reboot the system, in accordance with a region-based memory address mapping technique.

20 Claims, 14 Drawing Sheets

SYSTEM AND METHOD FOR MEMORY ACCESS DYNAMIC MODE SWITCHING

CROSS REFERENCE TO RELATED APPLICATIONS

This patent disclosure claims the benefit of U.S. Provisional Application Ser. No. 61/927,316 filed on Jan. 14, 2014, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

The speed at which memory is accessed by, for example, system-on-chip (SOC) devices (e.g. in server computers or mobile telephones) has rapidly increased in recent years. In particular, double-data-rate (DDR) memory is a type of very fast computer memory that uses clock signals in a manner that allows twice the data to be transferred in the same amount of time. As the speed of memory access has increased, performance (e.g., data throughput) has increased. Furthermore, in some configurations, electrical power consumption has increased with the speed of memory access.

Today, more and more SOC applications demand a memory system having a more efficient balance between performance and power consumption. For example, certain SOC configurations demand a 32-bit double data rate 3 (DDR3) interface for high performance and also demand low power consumption for some lower performance modes of operation (e.g., 16-bit DDR3). In a configuration having two 16-bit DDR devices, one of the two devices may be powered down in a low performance/low power consumption mode of operation. However, in such a configuration, transitioning back to a high performance/high power consumption mode of operation, where both 16-bit DDR devices are powered up, typically includes having to remap regions of memory and/or reboot the SOC device. Such remapping and/or rebooting results in inefficient operation of the SOC device.

SUMMARY

In general, in one aspect this specification discloses an apparatus. In one embodiment, the apparatus includes a first memory and a second memory. The apparatus also includes a memory control logic configured to facilitate memory access of the first memory and the second memory using either a first memory access mode or a second memory access mode. The first memory access mode is configured to facilitate memory access of both the first memory and the second memory. The second memory access mode is configured to facilitate memory access of one of the first memory or the second memory, providing less performance and using less electrical power than the first memory access mode. The memory control logic is configured to dynamically switch between the first memory access mode and the second memory access mode, without having to remap memory or reboot the apparatus. Switching occurs in response to an address of a memory access command and in accordance with a region-based memory address mapping technique. The region-based memory address mapping technique associates regions of memory with the first memory access mode or the second memory access mode.

In general, in another aspect, this specification discloses a method. In one embodiment, the method includes generating a first memory access command having a first memory address and a first memory length. The method also includes checking a memory access mode indicator associated with the first memory address to determine whether memory is to be accessed in a first memory access mode or a second memory access mode. When the memory access mode indicator indicates the first memory access mode, the first memory access command is sent to a first memory and a second memory to access both the first memory and the second memory. When the memory access mode indicator indicates the second memory access mode, a second memory access command is generated. The second memory access command has a second memory address and a second memory length that are based on, at least in part, the first memory address and a region-based memory address mapping technique. Furthermore, when the memory access mode indicator indicates the second memory access mode, device masks of the first memory and the second memory are set. The device masks are set based on whether the first memory or the second memory is to be accessed by the second memory access command, as defined by the region-based memory address mapping technique. The second memory access command and the device masks may be sent to the first memory and the second memory to access one of the first memory or the second memory based on the device masks.

In general, in another aspect, this specification discloses an integrated circuit device. In one embodiment, the integrated circuit device includes a central processing logic, a direct memory access logic operably connected to the central processing logic, first double data rate memory, and second double data rate memory. The integrated circuit device also includes memory control logic operably connected to the central processing logic, the direct memory access logic, the first double data rate memory, and the second double data rate memory. The memory control logic is configured to facilitate memory access of both the first double data rate memory and the second double data rate memory in a first memory access mode. The memory control logic is also configured to facilitate memory access of one of the first double data rate memory and the second double data rate memory in a second memory access mode. The memory control logic is also configured to dynamically switch between the first memory access mode and the second memory access mode, without having to remap memory or reboot the integrated circuit device, based on a region-based memory address mapping technique.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Figure 1:
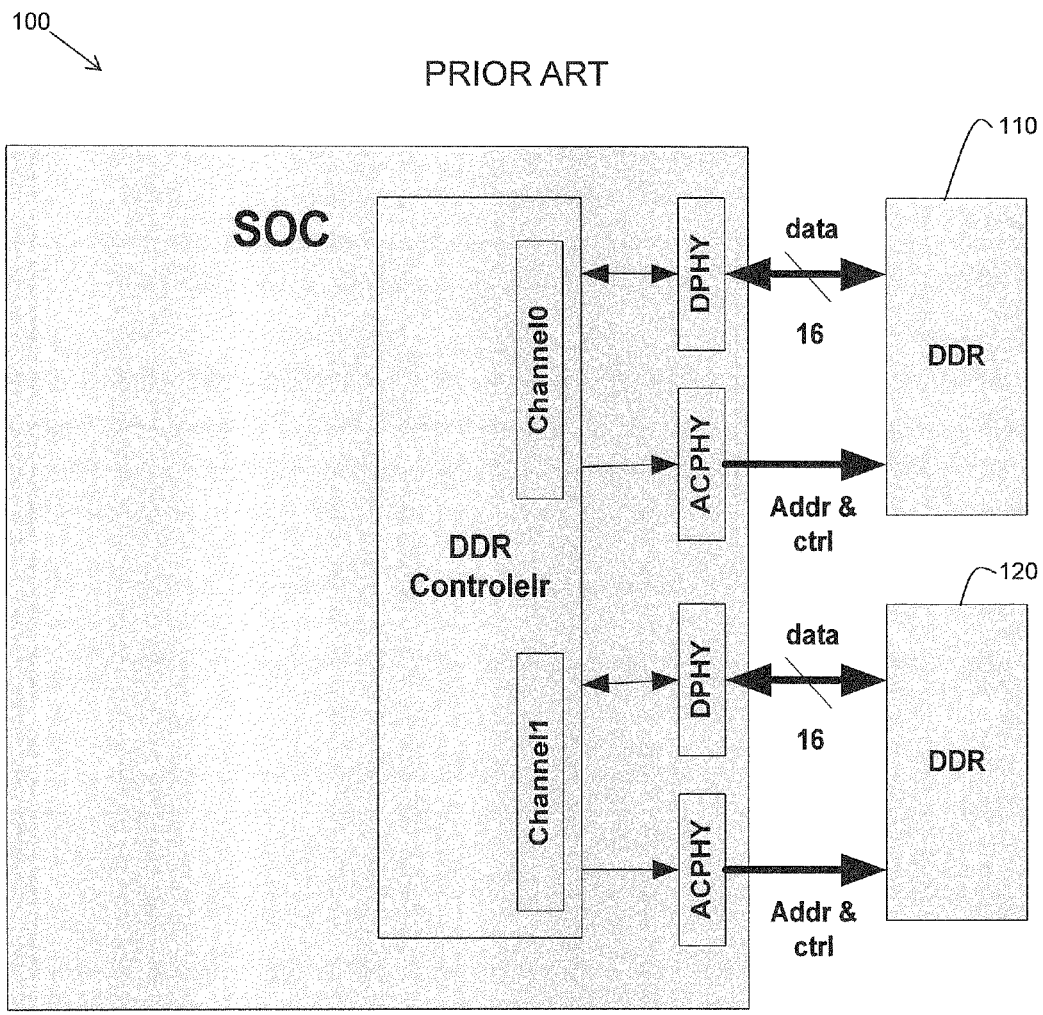
FIG. 1 illustrates an example of a prior art system having a dual channel memory configuration.

Described herein are examples of systems, methods, and other embodiments associated with providing dynamic switching between a high profile (e.g., a high performance/high power consumption) memory access mode and a low profile (e.g., a low performance/low power consumption) memory access mode, without having to reallocate memory and/or reboot a system. In one embodiment, an apparatus includes first memory and second memory configured to be accessed by having data written thereto and read therefrom.

Even though example embodiments may be described herein such that the first memory corresponds to a first memory device and the second memory corresponds to a second memory device, a memory may include more than one memory device. That is, the first memory may include one or more memory devices (e.g., one 16-bit data memory device or two 8-bit data memory devices). Similarly, the second memory may include one or more memory devices (e.g., one 16-bit data memory device or two 8-bit data memory devices).

As another example, the first memory may include one 32-bit data memory device or four 8-bit data memory devices. Similarly, the second memory may include one 32-bit data memory device or four 8-bit data memory devices. Each memory device may be, for example, a double data rate (DDR) dynamic random access memory (DRAM) device, in accordance with one embodiment. As a further example, the first memory may include two 16-bit data memory devices. The second memory may similarly include two 16-bit data memory devices. Other combinations of more than one memory device for the first memory or the second memory are possible as well, in accordance with other embodiments.

The apparatus also includes a memory control logic which includes a full access logic and a half access logic. The full access logic is configured to facilitate memory access of both the first memory and the second memory in a first memory access mode, providing high memory access performance. The half access logic is configured to facilitate memory access of one of the first memory or the second memory in a second memory access mode which sacrifices memory access performance (e.g., bandwidth) for reduced power consumption. The memory control logic allows for dynamic switching between the first and second memory access modes, without having to remap memory or reboot the apparatus. In one embodiment, dynamic switching from the first memory access mode to the second memory access mode (or vice versa) is in response to an address of a memory access command in accordance with a region-based memory address mapping technique which associates regions of memory with the first memory access mode or the second memory access mode.

The terms "high profile memory access mode", "high performance memory access mode", "high power consumption memory access mode", "high performance/high power consumption memory access mode", and "first memory access mode" are used interchangeably herein.

The terms "low profile memory access mode", "low performance memory access mode", "low power consumption memory access mode", "low performance/low power consumption memory access mode", and "second memory access mode" are used interchangeably herein.

In accordance with one embodiment, the first memory access mode is configured to accommodate twice as many data bits as the second memory access mode during memory access.

FIG. 1 illustrates an example of a prior art system 100 having a dual channel memory configuration. Two 16-bit double data rate (DDR) devices 110 and 120 are configured as two DDR channels where each channel has a 16-bit DDR interface. The dual channel configuration provides the system 100 with 32-bit DDR interface bandwidth. However, the configuration of FIG. 1 uses two full sets of data physical layers (DPHY) and address/control physical layers (ACPHY) which adds to the cost, complexity, and power consumption of the system 100. Furthermore, in certain instances, an address interleaving mode has to be used to achieve full bandwidth (32-bit DDR interface). Also, it is not always possible to simply power down one channel, to reduce power consumption, and still have the other channel operate normally. For example, when address interleaving is used, the system 100 may first have to be rebooted, due to memory mapping constraints, before powering down one of the channels.

Figure 2A:
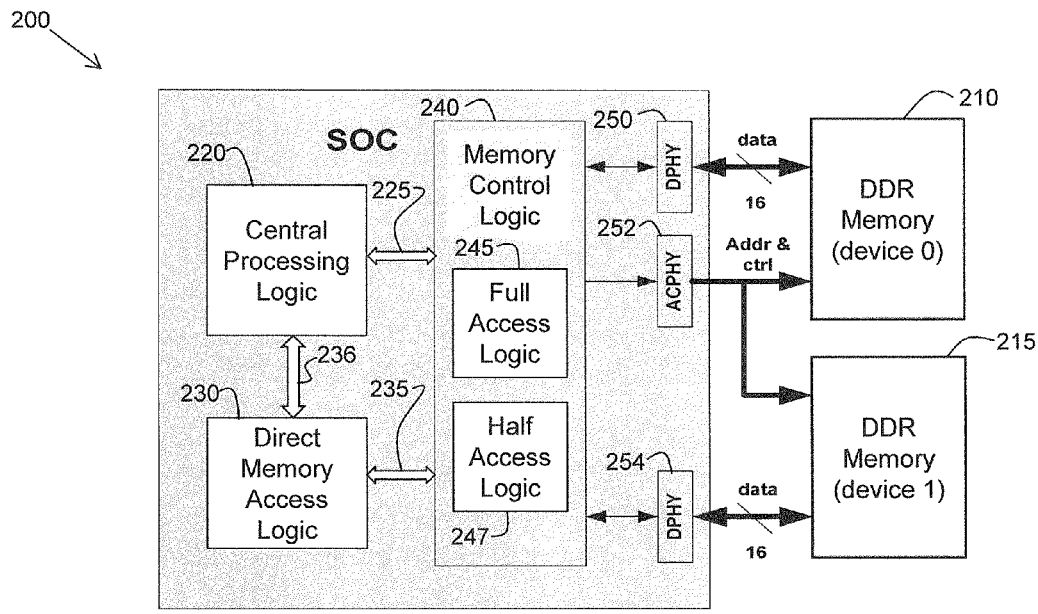
FIG. 2A illustrates an example embodiment of a system having a memory configuration with two memory devices both powered up in a first memory access mode.
Figure 2B:
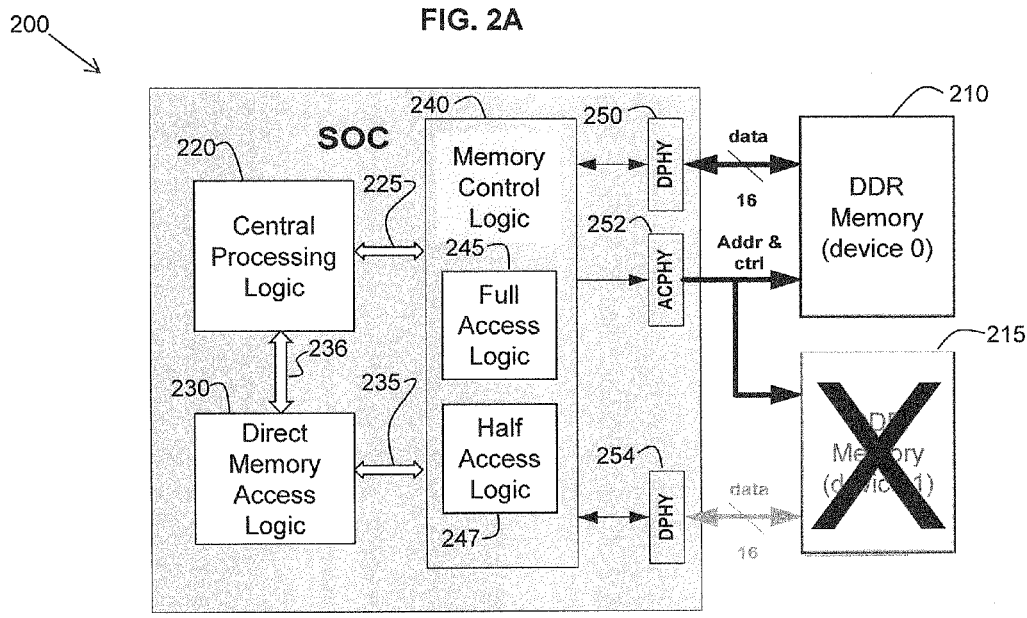
FIG. 2B illustrates the embodiment of the system of FIG. 2A having a memory configuration with one of the two memory devices powered up in a second memory access mode.

FIG. 2A illustrates an example embodiment of a system 200 having a memory configuration with two memory devices 210 (device 0) and 215 (device 1) both powered up in a first memory access mode (e.g., a high performance/high power consumption memory access mode). FIG. 2B illustrates the embodiment of the system 200 of FIG. 2A having a memory configuration with memory device 210 powered up in a second memory access mode (e.g., a low performance/low power consumption memory access mode), while memory device 215 is powered down (as represented in FIG. 2B by the "X" over memory device 215). In one embodiment, the memory devices 210 and 215 are DDR (e.g., DDR3) dynamic random access memory (DRAM) memory devices.

In addition to first and second memory devices 210 and 215, the system 200 includes central processing logic 220, direct memory access logic 230, and memory control logic 240. The system 200 also includes full access logic 245, half access logic 247, data physical layer (DPHY) 250, address and control physical layer (ACPHY) 252, and data physical layer (DPHY) 254. As seen in FIGS. 2A and 2B, the ACPHY 252 is shared between the first memory device 210 and the second memory device 215, resulting in a more efficient and lower cost design of the system 200 as compared to the prior art system 100.

In one embodiment, the system 200 is implemented on a chip (i.e., a system-on-chip or SOC configuration) including one or more integrated circuits configured to perform one or more of the functions described herein. In the embodiment of FIGS. 2A and 2B, the full access logic 245 and the half access logic 247 are part of the memory control logic 240. However, in accordance with another embodiment, full access logic 245 and the half access logic 247 may be implemented separately from the memory control logic 240. In another embodiment, the logics of the system 200 may be part of an executable algorithm configured to perform the functions of the logics where the algorithm is stored in a non-transitory medium. In still another embodiment, the system 200 is implemented on a chip, except for the memory devices 210 and 215 which are implemented on other chips.

Referring to FIG. 2A, the central processing logic 220 is operably connected to the memory control logic 240 via a communication bus 225. The central processing logic 220 is configured to provide commands to the memory control logic 240 via the communication bus 225 to, for example, program the memory control logic 240 and tell the memory control logic 240 and other devices where data is stored in the DDR memory devices 210 and 215 via, for example, a memory mapping technique. In one embodiment, the communication bus 225 is an advanced peripheral bus (APB).

The direct memory access (DMA) logic 230 is operably connected to the memory control logic 240 via a communication bus 235 and to the central processing logic 220 via a communication bus 236. The DMA logic 230 is configured to access the DDR memory devices 210 and 215 via the communication bus 235. For example, both commands and data may be communicated between the DMA logic 230 and the memory control logic 240 via the communication bus 235 for the purpose of accessing the DDR memory devices 210 and 215.

The first and second DDR memory devices 210 and 215 are configured to have data written to the DDR memory devices 210 and 215, and read from the DDR memory devices 210 and 215 under the command of the memory control logic 240. DDR memory devices 210 and 215 are a type of very fast computer memory that uses clock signals in a manner that allows twice the data to be transferred in the same amount of time. For example, in one embodiment, the DDR memory devices 210 and 215 are double data rate synchronous dynamic random access memory (DDR SRAM). In this manner, efficient memory access may be achieved.

As used herein, the terms "accessing memory" or "memory access" refer to the process of writing data to and/or reading data from memory. Referring to FIG. 2A, the full access logic 245 is configured to facilitate memory access of both the first memory device 210 and the second memory device 215 in a first memory access mode (e.g., a high performance/low power consumption memory access mode). The half access logic 247 is configured to facilitate memory access of one of the first memory device 210 or the second memory device 215 in a second memory access mode (e.g., a low performance/low power consumption memory access mode which provides less performance and uses less electrical power than the first memory access mode). Also, the memory control logic 240 is configured to dynamically switch between the first memory access mode and the second memory access mode without having to reboot the system 200.

In accordance with one embodiment, referring to FIG. 2A, in the first memory access mode, both the first memory device 210 and the second memory device 215 are powered up. The full access logic 245 is employed to access both memory devices, providing a high performance 32-bit memory access interface. Referring to FIG. 2B, in the second memory access mode, only one of the two memory devices is powered up (e.g., memory device 210). The other memory device (e.g., 215) is powered down. The half access logic 247 is employed to access the powered memory device, providing a lower performance 16-bit memory access interface.

In one embodiment, a region-based memory address mapping technique is implemented by the memory control logic 240, allowing the memory control logic 240 to dynamically switch between the first memory access mode and the second memory access mode without having to reboot the system 200 or remap the memory between modes. The region-based memory address mapping technique defines regions of memory, where any one region of memory is specified by a start address, a region size, and a memory access mode indicator (e.g., a full DRAM map bit or a half DRAM map bit), in accordance with one embodiment.

The memory access mode indicator indicates which memory access mode (first or second) and, therefore, which access logic (full access logic 245 or half access logic 247) is to be employed when accessing a defined region of memory. In one embodiment, the memory control logic 240 is configured to check the memory access mode indicator associated with a memory access operation (i.e., a memory write operation or a memory read operation to an addressed region of memory) to determine whether the full access logic 245 or the half access logic 247 is to perform the memory access operation. Details of such region-based memory address mapping techniques and associated memory access operations are discussed later herein with respect to the remaining figures.

In one embodiment, the half access logic 247 is configured to apply a data masking technique and a data packing technique in association with a memory write operation of the second memory access mode. The data masking technique prevents writing to one of the first memory device 210 or the second memory device 215. The data packing technique reorganizes data to be written to one of the first memory device 210 or the second memory device 215. Furthermore, in one embodiment, the half access logic 247 is configured to apply a data packing technique in association with a memory read operation of the second memory access mode. The data packing technique reorganizes data read from one of the first memory device 210 or the second memory device 215. Details of such masking and packing techniques and associated memory access operations are discussed later herein with respect to the remaining figures.

Figure 3:
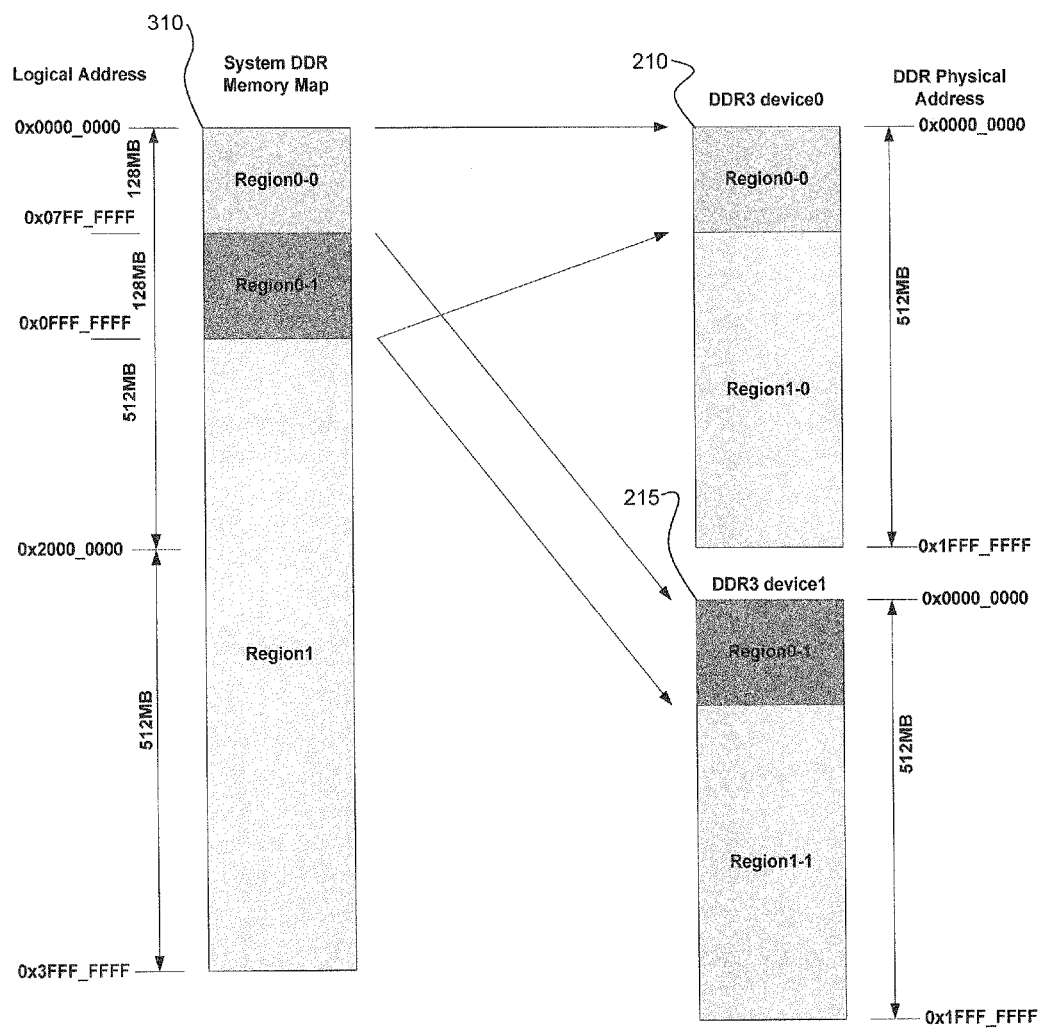
FIG. 3 illustrates an example embodiment of partitioning a system memory map into regions between a first memory device and a second memory device based on a region-based memory address mapping technique.

FIG. 3 illustrates an example embodiment of partitioning a system memory map 310 into regions between the first memory device 210 and the second memory device 215 of FIGS. 2A and 2B, in accordance with a region-based memory address mapping technique. In the system memory map 310, the address space is specified in several regions which can have different attributes. Each region may have a descriptor having the fields of "start address", "region size", and "memory access mode indicator" (indicating a first memory access mode or a second memory access mode).

The system memory map 310 specifies a 1 GB system DDR memory with memory addresses ranging from 0x0000_0000 to 0x3FFF_FFFF in hexadecimal format. In FIG. 3, two main regions of memory, Region0 and Region1, are specified in the system memory map 310. Region0 is further divided into two sub-regions, Region0-0 and Region0-1.

Region0 has a start address of 0x0000_0000, a region size of 256 MB, and a memory access mode indicator indicating a second memory access mode corresponding to a low performance/low power consumption memory access mode. In accordance with one embodiment, the half access logic 247 of the system 200 is configured to implement the second memory access mode. As seen in the example of FIG. 3, the first 128 MB of Region0 (i.e., Region0-0) is mapped to the first memory device 210. The second 128 MB of Region0 (i.e., Region0-1) is mapped to the second memory device 215.

Region1 has a start address of 0x2000_0000, a region size of 768 MB, and a memory access mode indicator indicating a first memory access mode corresponding to a high performance/high power consumption memory access mode. In accordance with one embodiment, the full access logic 245 of the system 200 is configured to implement the first memory access mode. As seen in the example of FIG. 3, the memory addresses for Region1 are mapped to the first memory device 210 (see Region1-0) and the second memory device 215 (see Region1-1) in an interleaving manner (e.g., interleaving every other 2 bytes).

Figure 4:
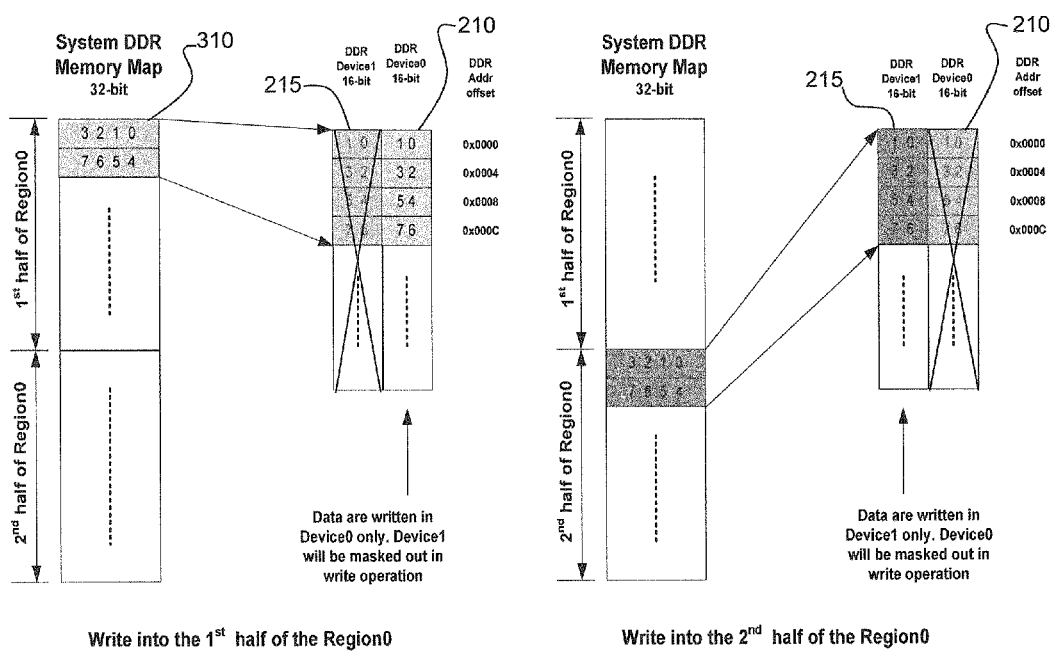
FIG. 4 illustrates a first example embodiment of a process of writing data to regions of a first memory device and a second memory device based on a region-based memory address mapping technique.

FIG. 4 illustrates a first example embodiment of a process of writing data to regions of the first memory device 210 and the second memory device 215 of FIGS. 2A and 2B, based on the region-based memory address mapping technique of FIG. 3. In FIG. 4, a second memory access mode (e.g., a low performance/low power consumption memory access mode) is illustrated. In the second memory access mode, data in a region is stored in only one memory device (either memory device 210 or memory device 215).

As shown in FIG. 4, the first half of Region0 (Region0-0) is mapped to and stored in first memory device 210 (device 0). A data masking technique is used to mask out device 1 in the write operation. The second half of Region0 (Region0-1) is mapped to and stored in second memory device 215 (device 1). A data masking technique is used to mask out device 0 in the write operation. In accordance with one embodiment, the data masking technique is a true data bit masking (DQM) technique. In accordance with another embodiment, the data masking technique is a chip-select (CSn) technique.

In this manner, data in Region0-0 may be accessed (written to or read from) from first memory device 210 via a low performance (e.g., low throughput) 16-bit data interface, while second memory device 215 is powered down. Similarly, data in Region0-1 may be accessed (written to or read from) from second memory device 215 via a low performance (e.g., low throughput) 16-bit data interface, while first memory device 215 is powered down.

Figure 5:
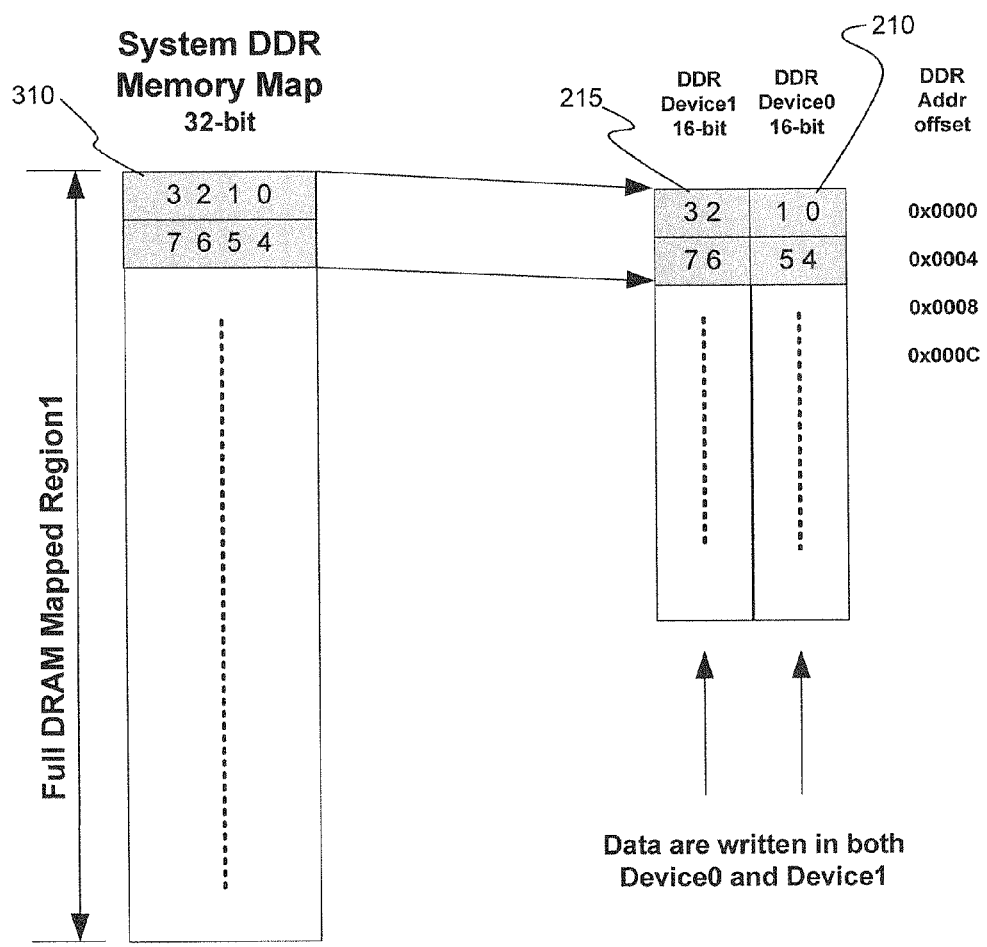
FIG. 5 illustrates a second example embodiment of a process of writing data to regions of a first memory device and a second memory device based on a region-based memory address mapping technique.

FIG. 5 illustrates a second example embodiment of a process of writing data to regions of the first memory device 210 and the second memory device 215 of FIGS. 2A and 2B, based on the region-based memory address mapping technique of FIG. 3. In FIG. 5, a first memory access mode (e.g., a high performance/high power consumption memory access mode) is illustrated. In the first memory access mode, data in a region is stored in both memory devices (memory device 210 and memory device 215). As shown in FIG. 5, data in Region1 is mapped to and stored in both the first memory device 210 (device 0) and the second memory device 215 (device 1) in an interleaved manner (e.g., interleaving every other two bytes of data). In this manner, data in Region1 may be accessed (written to or read from) from first memory device 210 and second memory device 215 via a high performance (e.g., high throughput) 32-bit data interface, with both memory devices powered up.

Because of the region-based memory address mapping technique, the system 200 may be switched between the 32-bit high performance mode (first memory access mode) and the 16-bit low performance mode (second memory access mode) dynamically, without having to reboot the system 200 or remap the regions. In accordance with one embodiment, the full access logic 245 facilitates the first memory access mode and the half access logic 247 facilitates the second memory access mode. Furthermore, the memory control logic 240 facilitates dynamically switching between the first memory access mode and the second memory access mode.

Figure 6:
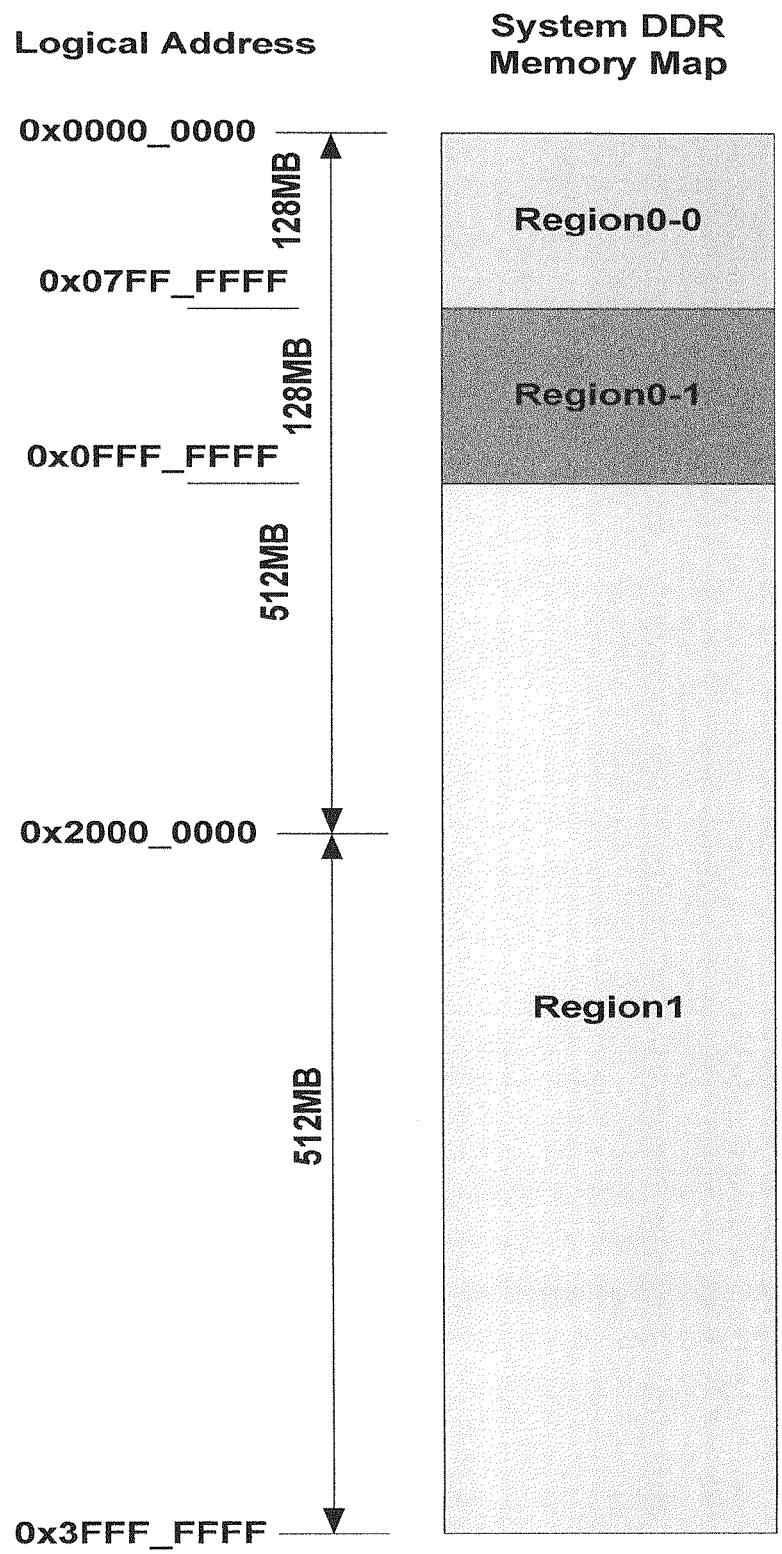
FIG. 6 illustrates an example embodiment of defining memory regions and access commands in accordance with a region-based memory address mapping technique.

To summarize and re-emphasize, FIG. 6 illustrates an example embodiment of defining memory regions and access commands in accordance with a region-based memory address mapping technique. As seen in FIG. 6, Region0 has a start address of 0x0000_0000, a region size of 256 MB, and is accessed in a second memory access mode (accessing only one memory device). Region1 has a start address of 0x1000_0000, a region size of 768 MB, and is accessed in a first memory access mode (accessing both memory devices). In accordance with one embodiment, a memory access command (i.e., a memory write command or a memory read command) will have arguments of "address" and "length" as follows: READ (addr, length), WRITE (addr, length). For any memory access (read or write), no region crossing is allowed, in accordance with one embodiment.

Figure 7:
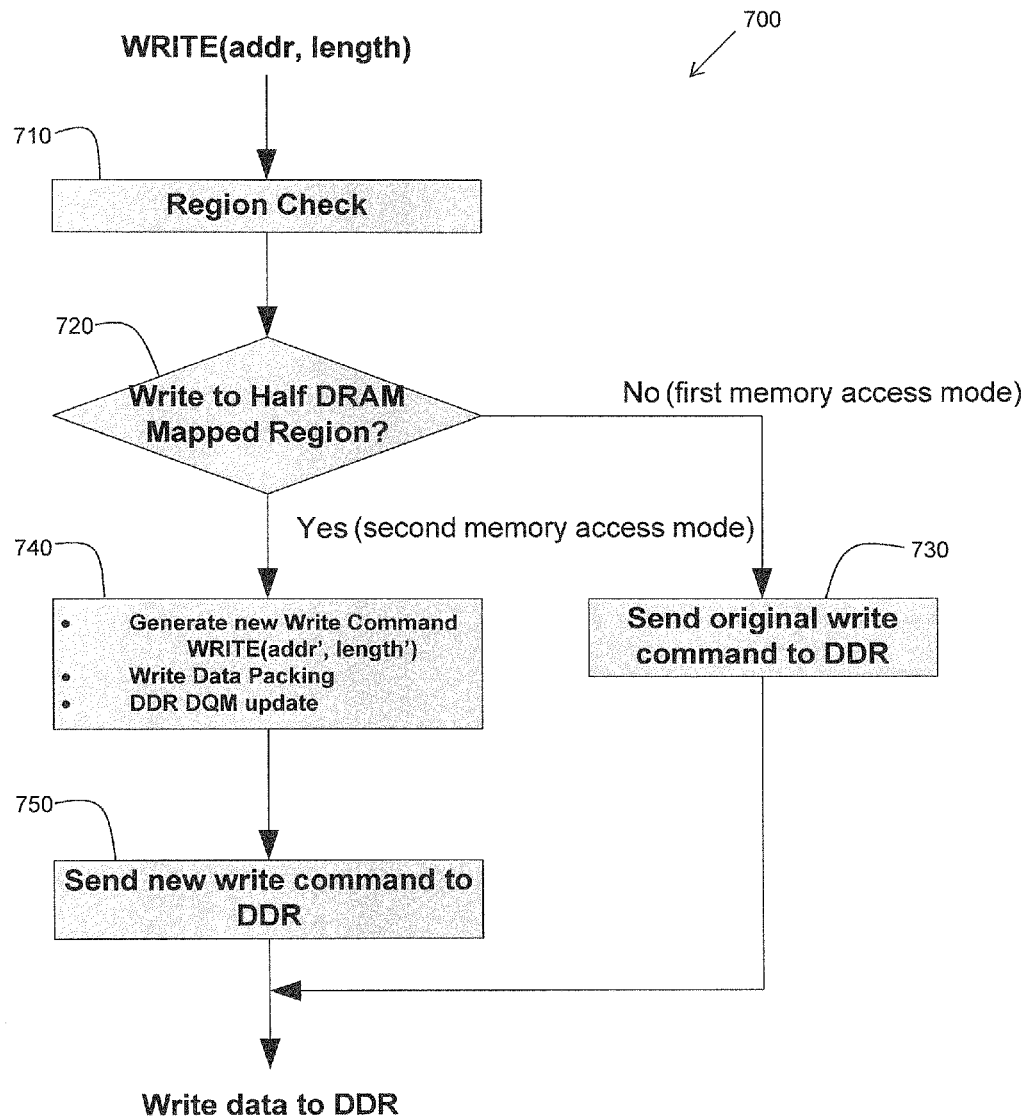
FIG. 7 illustrates an example embodiment of a method for writing data to memory as executed by the system of FIGS. 2A and 2B.

FIG. 7 illustrates an example embodiment of a method 700 for writing data to memory as executed by the system 200 of FIGS. 2A and 2B. Method 700 is implemented to be performed by the system 200 of FIGS. 2A and 2B, or by a computing device (e.g., an integrated circuit device) configured with an algorithm of method 700. Method 700 will be described from the perspective that the full access logic 245 and the half access logic 247 are part of the memory control logic 240, and that memory mapping via a region-based memory address mapping technique is established in the memory control logic 240.

Method 700 starts when a memory write operation is to be performed in response to a generated write command (a first memory access command). The write command WRITE (addr, length) includes a first memory address "addr" and a first memory length "length". Upon initiating method 700, at 710, the system 200 performs a region check by checking a memory access mode indicator associated with the first memory address of the write command (an addressed region of memory) to determine whether memory is to be accessed in a first or second memory access mode. At 720, when the memory access mode indicator indicates the first memory access mode, the method proceeds to 730 where the write command (first memory access command) is sent to the DDR memory devices 210 and 215 for full 32-bit interface access (i.e., to access memory from both 16-bit DDR memory devices 210 and 215). Data associated with the write command is written, in an interleaved manner, to both memory devices 210 and 215.

At 720, when the memory access mode indicator indicates the second memory access mode, the method proceeds to 740 where a new write command (a second memory access command) is generated. The new write command WRITE (addr', length') has a second memory address "addr'" and a second memory length "length'" based on, at least in part, the first memory address and the region-based memory address mapping technique. One embodiment of an algorithm for generating the new write command WRITE (addr', length') is discussed in detail later herein.

Furthermore, at 740, device masks are set for the first memory device 210 and the second memory device 215 based on whether the first memory device 210 or the second memory device 215 is to be accessed by the second memory access command. Also, at 740, a write data packing process is performed on data to be written to memory which is associated with the second memory access command. The write data packing process reorganizes the data to be written to one of the first memory device 210 or the second memory device 215.

At 750, the new write command WRITE (addr', length') and the device masks are sent to the memory devices 210 and 215 to access (write the packed data to) one of the first memory device 210 or the second memory device 215. The device masks determine which device the packed data will be written to, in accordance with the region-based memory address mapping technique for half 16-bit interface access (i.e., to access memory from 16-bit DDR memory device 210 or 16-bit DDR memory device 215).

Figure 8:
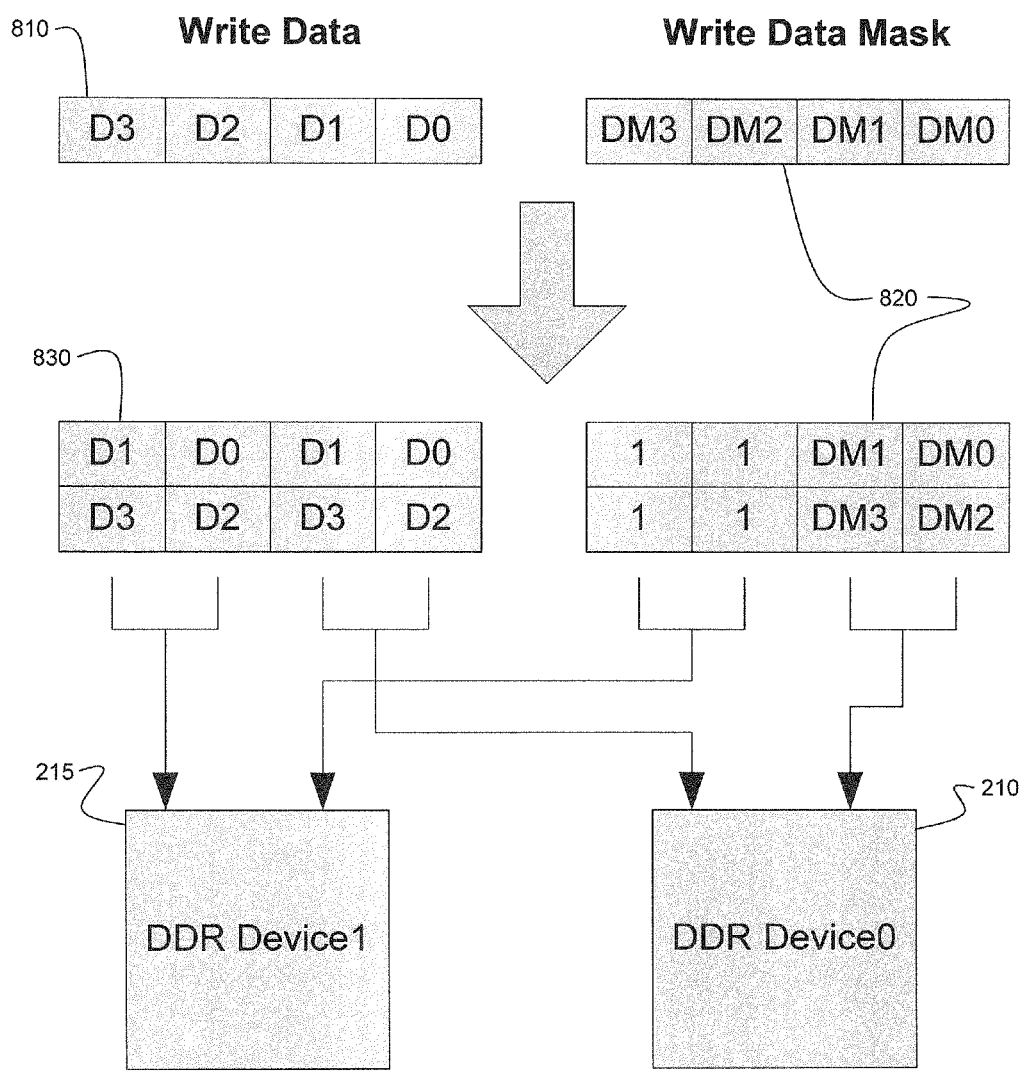
FIG. 8 illustrates an example embodiment of writing data to memory in accordance with the method of FIG. 7.

FIG. 8 illustrates an example embodiment of writing data to memory in accordance with the method 700 of FIG. 7. FIG. 8 shows four (4) bytes of data (D0, D1, D2, D3) 810 that are to be written to memory in accordance with the second memory access mode (e.g., a low performance/low power consumption memory access mode). Each byte of data is 8-bits, in accordance with one embodiment. The four (4) bytes of data (D0, D1, D2, D3) 810 are packed (reorganized) into packed data 830. The packing effectively duplicates the four (4) bytes of data.

Furthermore, the data masks 820 are set such that all four (4) bytes of data are written to first memory device 210 (device 0) but not to second memory device 215 (device 1), as dictated by the memory mapping and in accordance with a true data bit masking (DQM) technique. In accordance with another embodiment, the data masking may be accomplished by setting the chip-select (CSn) of second memory device 215 to logic high, for example.

In this manner, the data 810 may be written to the first memory device 210 while the second memory device 215 is powered down. In accordance with one embodiment, the half access logic 247 of the system 200 facilitates the writing of the data in the example of FIG. 8. It is noted here that a different four (4) bytes of data may be written in a similar manner to the second memory device 215 while the first memory device 210 is powered down, in accordance with the region-based memory address mapping technique.

Figure 9:
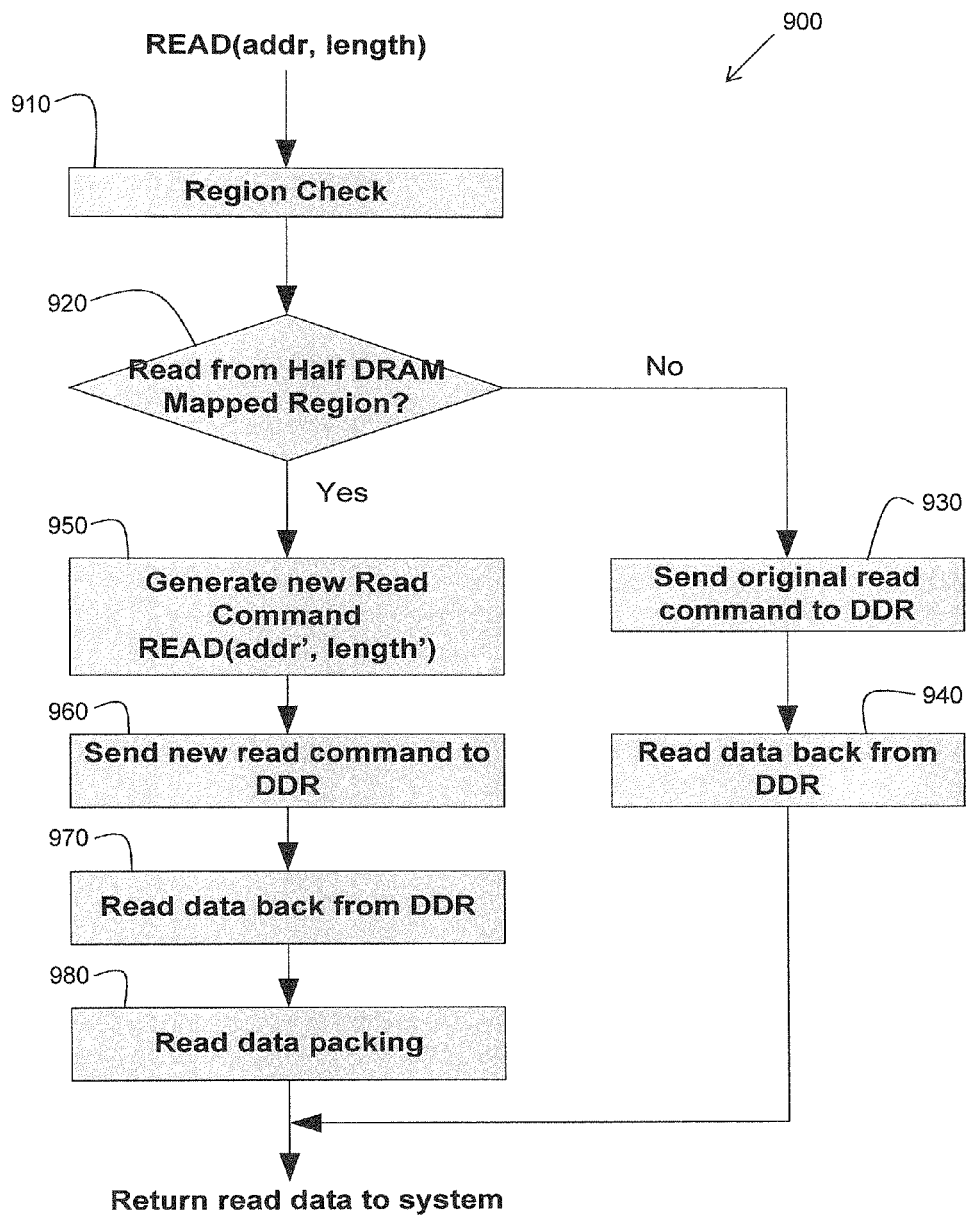
FIG. 9 illustrates an example embodiment of a method for reading data from memory as executed by the system of FIGS. 2A and 2B.

FIG. 9 illustrates an example embodiment of a method 900 for reading data from memory as executed by the system 200 of FIGS. 2A and 2B. Method 900 is implemented to be performed by the system 200 of FIGS. 2A and 2B, or by a computing device (e.g., an integrated circuit device) configured with an algorithm of method 900. Method 900 will be described from the perspective that the full access logic 245 and the half access logic 247 are part of the memory control logic 240, and that memory mapping via a region-based memory address mapping technique is established in the memory control logic 240.

Method 900 starts when a memory read operation is to be performed in response to a generated read command (a first memory access command). The read command READ (addr, length) includes a first memory address "addr" and a first memory length "length". Upon initiating method 900, at 910, the system 200 performs a region check by checking a memory access mode indicator associated with the first memory address of the read command to determine whether memory is to be accessed in a first or second memory access mode. At 920, when the memory access mode indicator indicates the first memory access mode, the method proceeds to 930 where the read command (first memory access command) is sent to the DDR memory devices 210 and 215 for full 32-bit interface access (i.e., to access memory from both 16-bit DDR memory devices 210 and 215). Data is read from both memory devices 210 and 215 at 940.

At 920, when the memory access mode indicator indicates the second memory access mode, the method proceeds to 950 where a new read command (a second memory access command) is generated. The new read command READ (addr', length') has a second memory address "addr'" and a second memory length "length'" based on, at least in part, the first memory address and the region-based memory address mapping technique. One embodiment of an algorithm for generating the new read command READ (addr', length') is discussed in detail later herein.

At 960, the new read command is sent to the first and second memory devices 210 and 215. At 970, the data is read from one of the first memory device 210 or the second memory device 215, in accordance with the region-based memory address mapping technique for half 16-bit interface access (i.e., to access memory from 16-bit DDR memory device 210 or 16-bit DDR memory device 215). At 980, a read data packing process is performed on the read data. The read data packing process reorganizes the data read from one of the first memory device 210 or the second memory device 215 such that the read data may be returned to the system 200.

Figure 10:
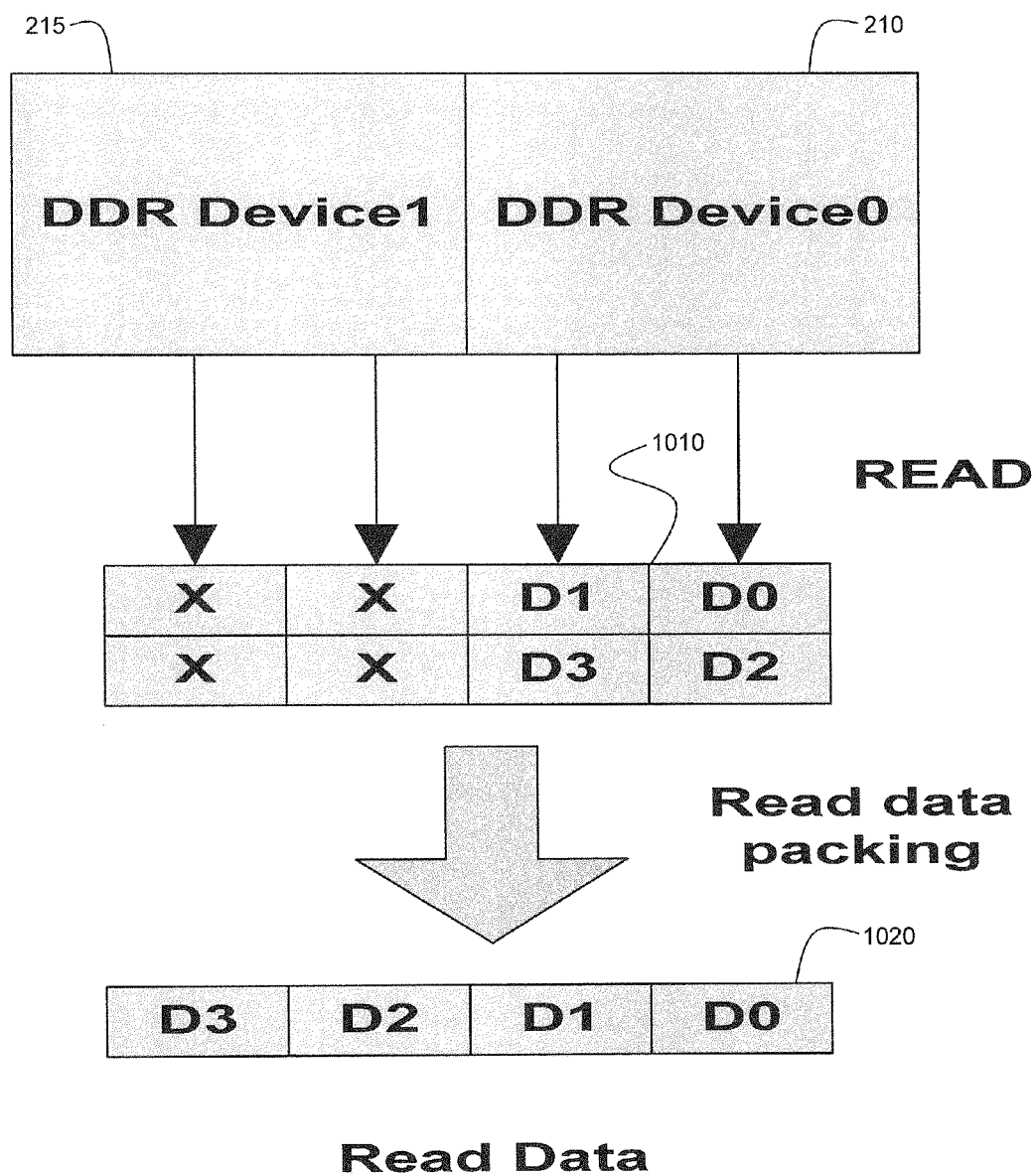
FIG. 10 illustrates an example embodiment of reading data from memory in accordance with the method of FIG. 9.

FIG. 10 illustrates an example embodiment of reading data from memory in accordance with the method 900 of FIG. 9. FIG. 10 shows four (4) bytes of data (D0, D1, D2, D3) 1010 that are to be read from memory in accordance with the second memory access mode (e.g., a low performance/low power consumption memory access mode). In accordance with one embodiment, the four (4) bytes of data (D0, D1, D2, D3) 1010 are read from the first memory device 210 (device 0). Notice that the four (4) bytes of data (D0, D1, D2, D3) 1010 read from the first memory device 210 are organized in the manner in which they were originally written to memory (e.g., similar to the data 830 of FIG. 8).

The second memory device 215 may also be addressed. However, data read from second memory device 215 (see the X's in FIG. 10) is ignored or thrown out since second memory device 215 is powered down during the second memory access mode in this example. The read data is then packed to put the four (4) bytes of data (D0, D1, D2, D3) 1010 in a form 1020 to be returned to the system 200. In this manner, the data 1010 may be read from the first memory device 210 while the second memory device 215 is powered down. In accordance with one embodiment, the half access logic 247 of the system 200 facilitates the reading of the data in the example of FIG. 10. It is noted here that a different four (4) bytes of data may be read in a similar manner from the second memory device 215 while the first memory device 210 is powered down, in accordance with the region-based memory address mapping technique.

Algorithm for Generating a New Memory Access Command

In accordance with one embodiment, an algorithm for generating a new write command WRITE (addr', length') or a new read command READ (addr', length'), as part of a second memory access mode, is discussed next herein. As discussed previously herein, such a new write command is generated at 740 in method 700, and such a new read command is generated at 950 in method 900.

When the memory access mode indicator indicates that the second memory access mode (e.g., a lower throughput 16-bit data interface mode) is to be used for a current memory access (read or write), a new memory access command is to be generated based on the original memory access command associated with the current memory access. In accordance with one embodiment, an address (addr) of the original memory access command is used to look-up the memory access mode indicator from a look-up table.

For example, the address (addr) of the original memory access command may be used to determine the region of memory, as defined by a region-based memory address mapping technique, to be accessed. The region of memory may be associated with a first memory access mode or a second memory access mode as discussed previously herein. Furthermore, the address (addr) of the original memory access command may be used to determine whether a first half of the region or a second half of the region is to be accessed.

In accordance with one embodiment, a new length (length') associated with a new memory access command is generated by doubling the length (length) associated with the original memory access command (i.e., length'=2*length). The new address (addr') of the new memory access command depends on whether the first half or the second half of the region of memory is to be accessed.

When the first half of the region of memory is to be accessed, the new address (addr') is determined as follows:

addr'=2*(addr−REGION_START_ADDRESS)+REGION_START_ADDRESS.

Furthermore, a device mask bit for the second memory device (device 1) may be set to 1 (don't access device 1), and a device mask bit for the first memory device (device 0) may be set to 0 (access device 0).

When the second half of the region of memory is to be accessed, the new address (addr') is determined as follows:

addr'=2*[addr−(REGION_SIZE/2)−REGION_START_ADDRESS]+REGION_START_ADDRESS.

Furthermore, a device mask bit for the second memory device (device 1) may be set to 0 (access device 1), and a device mask bit for the first memory device (device 0) may be set to 1 (don't access device 0).

In this manner, for a second memory access mode as defined herein, the algorithm described above takes advantage of a region-based memory address mapping technique that allows data to be accessed from one memory or the other, for a particular memory access command (a read command or a write command).

Figure 11:
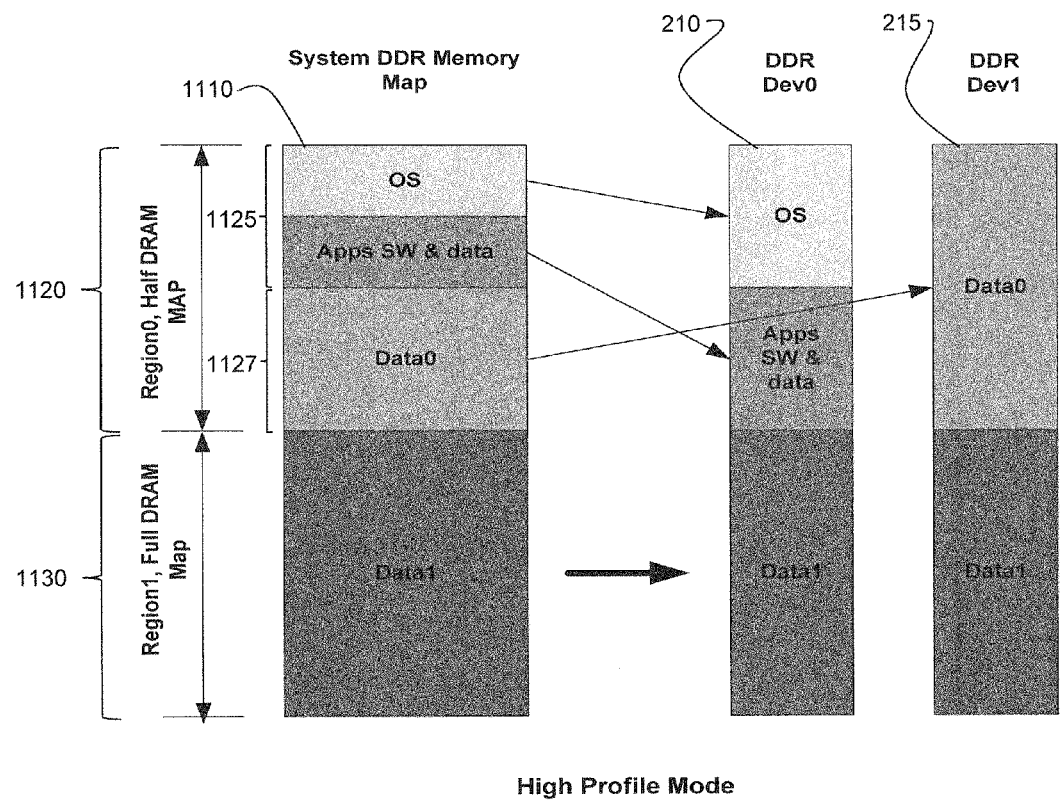
FIG. 11 illustrates an example embodiment of how memory, allocated in accordance with a region-based memory address mapping technique, is accessed in a first memory access mode.

FIG. 11 illustrates an example embodiment of how memory, allocated in accordance with a region-based memory address mapping technique, is accessed in a first memory access mode (i.e., a high profile memory access mode). The first half 1120 of the system memory map 1110 is a half DRAM map region. The second half 1130 of the system memory map 1110 is a full DRAM map region. The first half 1125 of the half DRAM map region 1120 is allocated to computer programs and data that are shared by the first memory access mode and a second memory access mode (the corresponding second memory access mode is described herein with respect to FIG. 12). The second half 1127 of the half DRAM map region 1120 is allocated to scratch data (Data0), and the second half 1130 of the system memory map 1110 is allocated to scratch data (Data1). The term "scratch data", as used herein, refers to data that may be moved and over-written within memory during normal operation.

In accordance with one embodiment, software and data allocated to the first half 1120 (half DRAM map region) of the system memory map 1110 are stored in a single memory device (either the first memory device 210 or the second memory device 215). Data allocated to the second half 1130 (full DRAM map region) of the system memory map 1110 are stored in two memory devices (both the first memory device 210 and the second memory device 215), for example, in an interleaved manner.

In one embodiment, the stored computer programs and data in region 1125 include an operating system (OS) and application software and associated data (Apps SW & data). The OS and Apps SW & data may be latency sensitive but do not have to operate under high-bandwidth conditions. Also, the OS and Apps SW & data do not change location within memory and are not over-written. Again, the second half 1127 of the half DRAM map region 1120, as well as the second half 1130 of the system memory map 1110, are used to store scratch data (Data0 and Data1, respectively). For example, the scratch data may be data that results from execution of the Apps SW & data.

As seen in FIG. 11, all of the OS is stored in the first memory device 210 (device 0). Similarly, all of the Apps SW & data are stored in the first memory device 210 (device 0). This is because the OS and the Apps SW & data are allocated to the half DRAM map region 1120 of the system memory map 1110. Similarly, all of Data0 is stored in the second memory device 215 (device 1) because Data0 is allocated to the half DRAM map region 1120. However, Data1 is distributed between both the first memory device 210 (device 0) and the second memory device 215 (device 1), for example, in an interleaved manner. This is because Data1 is allocated to the full DRAM map region 1130 of the system memory map 1110. As a result, Data 1 may be accessed (written and read) in a high-bandwidth (e.g., 32-bit memory access) manner.

In this manner, during a high profile memory access mode of operation, both memory devices 210 and 215 are powered up and scratch data may be accessed (written and read) via both memory devices 210 and 215. However, all of the OS and Apps SW & data reside in the first memory device 210 (device 0). With this type of region-based memory address mapping, a low profile memory access mode of operation may be dynamically switched to by powering down the second memory device 215 (device 1) without having to reallocate any of the OS and Apps SW & data and without having to reboot the system 200, as shown in FIG. 12.

Figure 12:
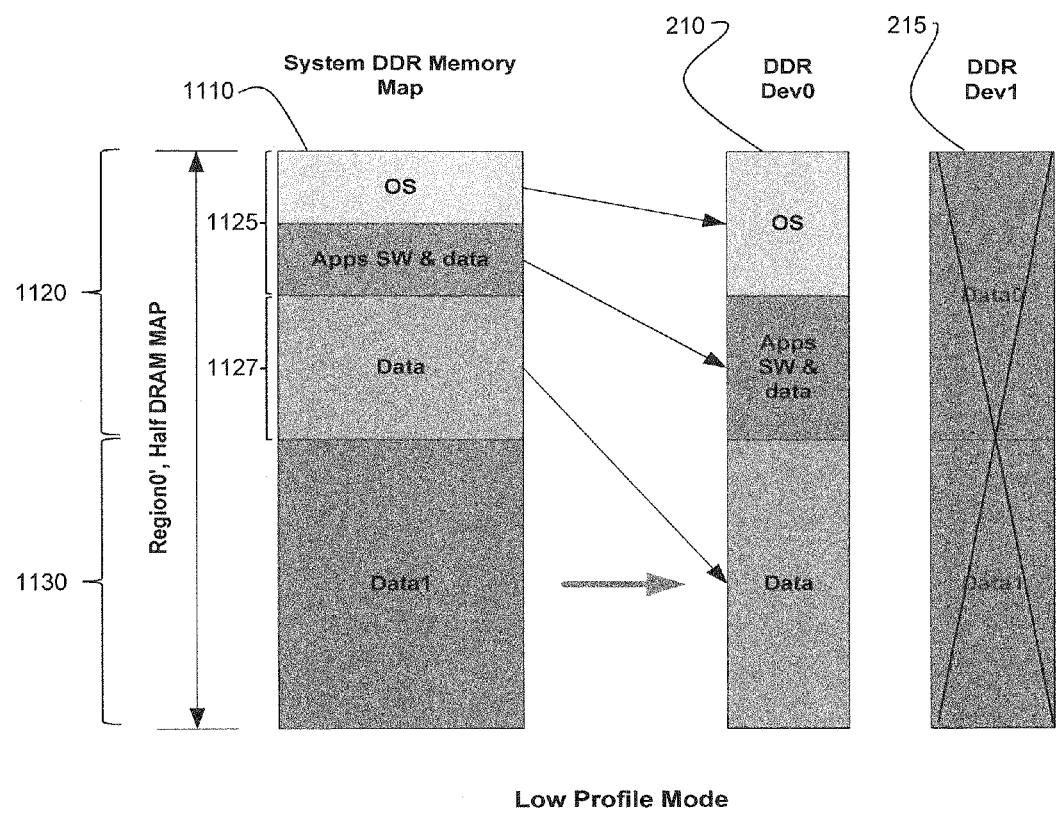
FIG. 12 illustrates an example embodiment of how memory, allocated in accordance with a region-based memory address mapping technique as in FIG. 11, is accessed in a second memory access mode.

FIG. 12 illustrates an example embodiment of how memory, allocated in accordance with a region-based memory address mapping technique as in FIG. 11, is accessed in a second memory access mode. As seen in FIG. 12, upon switching to a low profile memory access mode, the second memory device 215 (device 1) is turned off (powered down as represented by the "X" over memory device 215) to reduce electrical power consumption. Half of the bandwidth and memory capacity are used in the low profile mode as compared to the high profile mode.

In this manner, the system 200 may dynamically switch between a low profile memory access mode and a high profile memory access mode, depending on the bandwidth and power requirements at any particular time. By providing region-based memory address mapping as described herein, high profile and low profile modes of operation for memory access are supported. As a result, tradeoffs between memory access performance and memory device power consumption may be dynamically made during operation of the system 200.

Computing Device Embodiment

Figure 13:
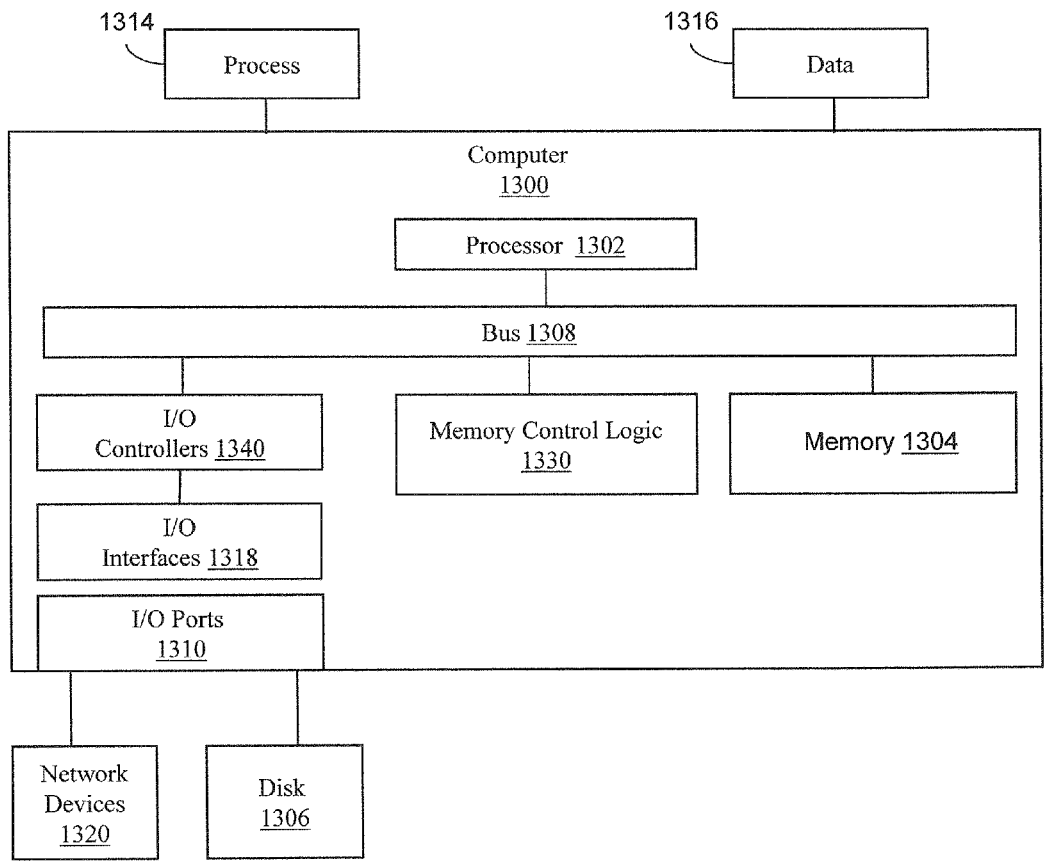
FIG. 13 illustrates an example embodiment of a computing device that is configured and/or programmed with one or more of the example systems and methods described herein, and/or equivalents.

FIG. 13 illustrates an example embodiment of a computing device that is configured and/or programmed with one or more of the example systems and methods described herein, and/or equivalents. The example computing device may be a computer 1300 that includes a processor 1302, a memory 1304, and input/output ports 1310 operably connected by a bus 1308. In one example, the computer 1300 may include memory control logic 1330 configured to facilitate memory access of a first memory device and a second memory device of the memory 1304, similar to memory control logic 240 shown in FIG. 2A and FIG. 2B. In different examples, the logic 1330 may be implemented in hardware, a non-transitory computer-readable medium with stored instructions, firmware, and/or combinations thereof. While the logic 1330 is illustrated as a hardware component attached to the bus 1308, it is to be appreciated that in one example, the logic 1330 could be implemented in the processor 1302.

In one embodiment, logic 1330 or the computer is a means (e.g., structure: hardware, non-transitory computer-readable medium, firmware) for performing the actions described. In some embodiments, the computing device may be one or more integrated circuits. The means may be implemented, for example, as an ASIC programmed to perform dynamic memory access mode switching to transition between high and low memory access performance modes. In other embodiments, the computing device may be a server operating in a cloud computing system, a server configured in a Software as a Service (SaaS) architecture, a smart phone, laptop, tablet computing device, and so on). The means may also be implemented as stored computer executable instructions that are presented to computer 1300 as data 1316 that are temporarily stored in memory 1304 and then executed by processor 1302.

Logic 1330 may also provide means (e.g., hardware, non-transitory computer-readable medium that stores executable instructions, firmware) for performing dynamic memory access mode switching to transition between high and low memory power consumption modes.

Generally describing an example configuration of the computer 1300, the processor 1302 may be a variety of various processors including dual microprocessor and other multi-processor architectures. A memory 1304 may include volatile memory and/or non-volatile memory. Non-volatile memory may include, for example, ROM, PROM, and so on. Volatile memory may include, for example, RAM, SRAM, DRAM, and so on.

A storage disk 1306 may be operably connected to the computer 1300 via, for example, an input/output interface (e.g., card, device) 1318 and an input/output port 1310. The disk 1306 may be, for example, a magnetic disk drive, a solid state disk drive, a floppy disk drive, a tape drive, a Zip drive, a flash memory card, a memory stick, and so on. Furthermore, the disk 1306 may be a CD-ROM drive, a CD-R drive, a CD-RW drive, a DVD ROM, and so on. The memory 1304 can store a process 1314 and/or a data 1316, for example. The disk 1306 and/or the memory 1304 can store an operating system that controls and allocates resources of the computer 1300.

The computer 1300 may interact with input/output devices via the i/o interfaces 1318 and the input/output ports 1310. Input/output devices may be, for example, a keyboard, a microphone, a pointing and selection device, cameras, video cards, displays, the disk 1306, the network devices 1320, and so on. The input/output ports 1310 may include, for example, serial ports, parallel ports, and USB ports.

The computer 1300 can operate in a network environment and thus may be connected to the network devices 1320 via the i/o interfaces 1318, and/or the i/o ports 1310. Through the network devices 1320, the computer 1300 may interact with a network. Through the network, the computer 1300 may be logically connected to remote computers. Networks with which the computer 1300 may interact include, but are not limited to, a LAN, a WAN, and other networks.

Integrated Circuit Device Embodiment

Figure 14:
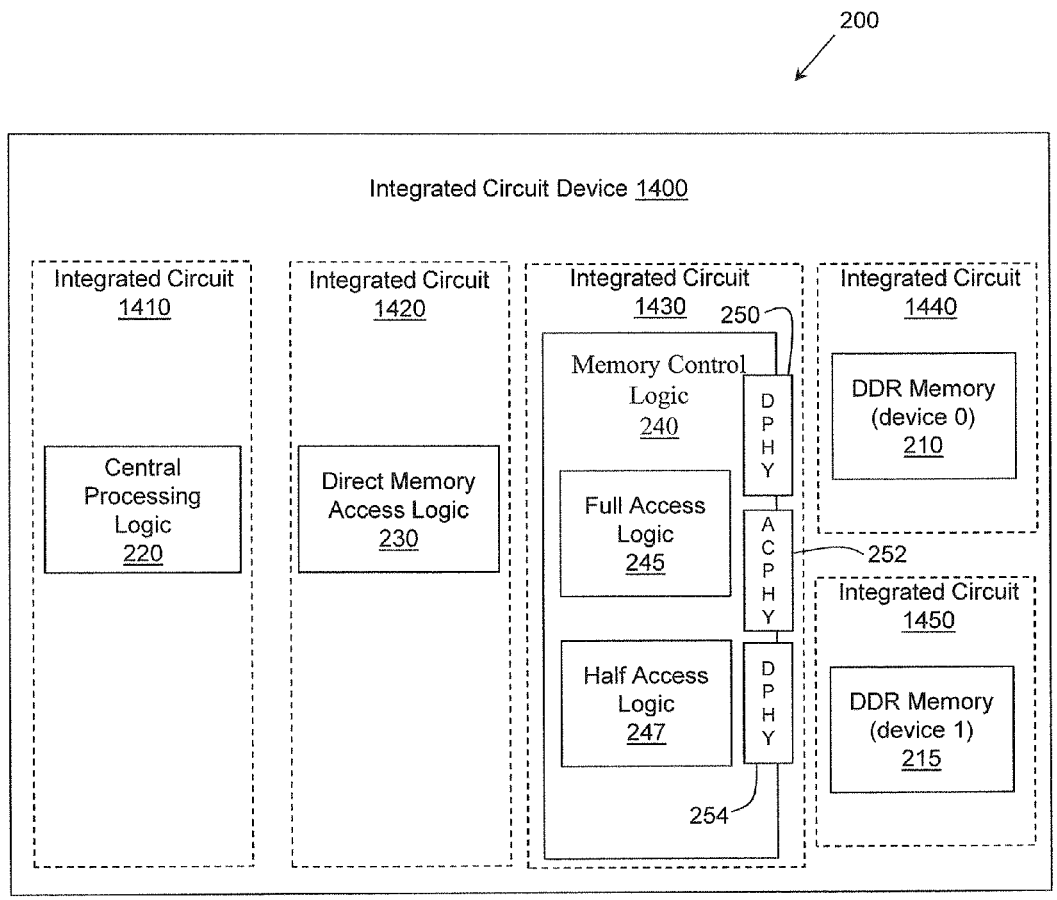
FIG. 14 illustrates one example embodiment of the system of FIGS. 2A and 2B implemented as an integrated circuit device and providing dynamic switching between a first memory access mode and a second memory access mode without having to reboot the integrated circuit device.

In one embodiment, the computing device may be the system 200 on one or more integrated circuit chips. FIG. 14 illustrates one example embodiment of the system 200 of FIGS. 2A and 2B implemented as an integrated circuit device 1400 and providing dynamic switching between a first memory access mode and a second memory access mode without having to reboot the integrated circuit device 1400. In this embodiment, the central processing logic 220 is embodied as a separate integrated circuit 1410. Additionally, the direct memory access logic 230 is embodied on an individual integrated circuit 1420. The memory control logic 240 (which includes the full access logic 245, the half access logic 247, the DPHYs 250 and 254, and the ACPHY 252) is also embodied on an individual integrated circuit 1430. Furthermore, the DDR memory 210 is embodied on an individual integrated circuit 1440, and the DDR memory 215 is embodied on an individual integrated circuit 1450.

The circuits are connected via connection paths to communicate signals. While integrated circuits 1410, 1420, 1430, 1440, and 1450 are illustrated as separate integrated circuits, they may be integrated into a common integrated circuit device 1400. Additionally, integrated circuits 1410, 1420, 1430, 1440, and 1450 may be combined into fewer integrated circuits or divided into more integrated circuits than illustrated.

In another embodiment, the central processing logic 220, the direct memory access logic 230, the memory control logic 240, and the DDR memories 210 and 215 (which are illustrated in integrated circuits 1410, 1420, 1430, 1440, and 1450, respectively) may be combined into a separate application-specific integrated circuit. In other embodiments, portions of the functionality associated with the central processing logic 220, the direct memory access logic 230, the memory control logic 240, and the DDR memories 210 and 215 may be embodied as firmware executable by a processor and stored in a non-transitory memory (e.g., a non-transitory computer storage medium).

DEFINITIONS AND OTHER EMBODIMENTS

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium" or "computer storage medium", as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C §101.

"Logic", as used herein, represents a component that is implemented with computer or electrical hardware, firmware, a non-transitory medium with stored instructions of an executable application or program module, and/or combinations of these to perform any of the functions or actions as disclosed herein, and/or to cause a function or action from another logic, method, and/or system to be performed as disclosed herein. Logic may include a microprocessor programmed with an algorithm, a discrete logic (e.g., ASIC), at least one circuit, an analog circuit, a digital circuit, a programmed logic device, a memory device containing instructions of an algorithm, and so on, any of which are configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. Logic is limited to statutory subject matter under 35 U.S.C. §101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks. The methods described herein are limited to statutory subject matter under 35 U.S.C §101.

To the extent that the term "includes" or "including" is employed in the detailed description or the claims, it is intended to be inclusive in a manner similar to the term "comprising" as that term is interpreted when employed as a transitional word in a claim.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

What is claimed is:

1. An apparatus comprising:
   first memory;
   second memory; and
   memory control logic configured to facilitate memory access of the first memory and the second memory using either a first memory access mode or a second memory access mode,
   (i) wherein the first memory access mode is configured to facilitate memory access of both the first memory and the second memory,
   (ii) wherein the second memory access mode is configured to facilitate memory access of one of the first memory or the second memory, providing less performance and using less electrical power than the first memory access mode, and
   (iii) wherein the memory control logic is configured to dynamically switch between the first memory access mode and the second memory access mode, without having to remap memory or reboot the apparatus, in response to an address of a memory access command and in accordance with a region-based memory address mapping technique which associates regions of memory with the first memory access mode or the second memory access mode.

2. The apparatus of claim 1, wherein the first memory access mode facilitates a data memory interface including twice as many data bits as facilitated by the second memory access mode.

3. The apparatus of claim 1, wherein the memory control logic includes full access logic configured to facilitate memory access of both the first memory and the second memory in the first memory access mode.

4. The apparatus of claim 1, wherein the memory control logic includes half access logic configured to facilitate memory access of one of the first memory or the second memory in the second memory access mode.

5. The apparatus of claim 4, wherein the half access logic is configured to apply a data masking technique and a data packing technique in association with a memory write operation of the second memory access mode, wherein the data masking technique prevents writing to one of the first memory or the second memory, and wherein the data packing technique reorganizes data to be written to one of the first memory or the second memory.

6. The apparatus of claim 4, wherein the half access logic is configured to apply a data packing technique in association with a memory read operation of the second memory access mode, wherein the data packing technique reorganizes data read from one of the first memory or the second memory.

7. The apparatus of claim 1, wherein the apparatus is a system-on-chip device further comprising:
   central processing logic, operably connected to the memory control logic, configured to provide commands to the memory control logic via a first communication bus; and
   direct memory access logic, operably connected to the memory control logic and the central processing logic, configured to access memory via a second communication bus.

8. The apparatus of claim 1, wherein the region-based memory address mapping technique defines a region of memory by a start address, a region size, and a memory access mode indicator.

9. The apparatus of claim 8, wherein the memory control logic is configured to check the memory access mode indicator to determine whether a write operation to an addressed region of memory is to be performed in the first memory access mode or the second memory access mode.

10. The apparatus of claim 8, wherein the memory control logic is configured to check the memory access mode indicator to determine whether a read operation from an addressed region of memory is to be performed in the first memory access mode or the second memory access mode.

11. A method comprising:
   generating a first memory access command having a first memory address and a first memory length;
   checking a memory access mode indicator associated with the first memory address to determine whether memory is to be accessed in a first memory access mode or a second memory access mode;
   when the memory access mode indicator indicates the first memory access mode:
      (i) sending the first memory access command to a first memory and to a second memory to access both the first memory and the second memory;
   when the memory access mode indicator indicates the second memory access mode:
      (i) generating a second memory access command having a second memory address and a second memory length based on, at least in part, the first memory address and a region-based memory address mapping technique,
      (ii) setting device masks of the first memory and the second memory based on whether the first memory or the second memory is to be accessed by the second memory access command as defined by the region-based memory address mapping technique, and
      (iii) sending the second memory access command and the device masks to the first memory and the second memory to access one of the first memory or the second memory based on the device masks.

12. The method of claim 11, further comprising performing a write data packing process on data, to be written to memory, that is associated with the second memory access command when the second memory access command is a memory write command, wherein the write data packing process reorganizes the data to be written to one of the first memory or the second memory.

13. The computer-implemented method of claim 11, further comprising performing a read data packing process on data, read from memory, that is associated with the second memory access command when the second memory access command is a memory read command, wherein the read data packing process reorganizes the data read from one of the first memory or the second memory.

14. The computer-implemented method of claim 11, wherein the first memory access mode is performed with higher memory access performance and consumes more electrical power than the second memory access mode.

15. The computer-implemented method of claim 11, wherein the first memory access mode is performed to accommodate twice as many data bits as the second memory access mode.

16. An integrated circuit device, comprising:
   central processing logic;
   direct memory access logic operably connected to the central processing logic;
   first double data rate memory;
   second double data rate memory; and
   memory control logic operably connected to the central processing logic, the direct memory access logic, the first double data rate memory, and the second double data rate memory,
   wherein the memory control logic is configured to:
      (i) facilitate memory access of both the first double data rate memory and the second double data rate memory in a first memory access mode,
      (ii) facilitate memory access of one of the first double data rate memory or the second double data rate memory in a second memory access mode, and
      (iii) dynamically switch between the first memory access mode and the second memory mode, without having to remap memory or reboot the integrated circuit device, based on a region-based memory address mapping technique.

17. The integrated circuit device of claim 16, wherein the first memory access mode is configured to accommodate twice as many data bits as the second memory access mode.

18. The integrated circuit device of claim 16, wherein the first double data rate memory and the second double data rate memory are each configured as a dynamic random access memory.

19. The integrated circuit device of claim 16, wherein the region-based memory address mapping technique defines a region of memory by a start address, a region size, and a memory access mode indicator.

20. The integrated circuit device of claim 19, wherein the memory control logic is configured to check the memory access mode indicator associated with an addressed region of memory to determine whether the first memory access mode or the second memory access mode is to be used to access the addressed region of memory.

* * * * *